(12) United States Patent
Rofougaran et al.

(10) Patent No.: US 8,036,626 B2
(45) Date of Patent: Oct. 11, 2011

(54) METHOD AND SYSTEM FOR A DISTRIBUTED TRANSCEIVER WITH DDFS CHANNEL SELECTION

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 968 days.

(21) Appl. No.: 11/860,296

(22) Filed: Sep. 24, 2007

(65) Prior Publication Data

US 2009/0081985 A1 Mar. 26, 2009

(51) Int. Cl.
*H04B 1/26* (2006.01)
(52) U.S. Cl. .......................... 455/323; 455/334
(58) Field of Classification Search .................. 455/230, 455/255–260, 313, 318, 323, 325, 326, 334, 455/339, 340, 341
See application file for complete search history.

(56) References Cited

U.S. PATENT DOCUMENTS

| | | | | |
|---|---|---|---|---|
| 7,164,899 B2 * | 1/2007 | Davis | ............................ | 455/313 |
| 7,519,348 B2 * | 4/2009 | Shah | ............................ | 455/285 |
| 7,610,032 B2 * | 10/2009 | Davis | ............................ | 455/313 |
| 2003/0162521 A1 * | 8/2003 | Vorenkamp et al. | .......... | 455/302 |

* cited by examiner

*Primary Examiner* — Nhan Le
(74) *Attorney, Agent, or Firm* — McAndrews, Held & Malloy, Ltd.

(57) ABSTRACT

Aspects of a method and system for a distributed transceiver with DDFS channel selection may include frequency-translating a first signal to generate one or more second signals utilizing a distributed mixer and an in-phase and quadrature mixing stage. The first signal may be an input signal to the distributed mixer, which may comprise a plurality of frequency conversion stages. The input signal to the distributed mixer may be an input signal to at least one of the plurality of frequency conversion stages and an output signal of the distributed mixer may be generated from one or more output signals or the plurality of conversion stages. The output signal from the distributed mixer may be an input signal to the in-phase and quadrature mixing stage and the one or more second signals may be generated from one or more output signals of the in-phase and quadrature mixing stage.

18 Claims, 5 Drawing Sheets

METHOD AND SYSTEM FOR A DISTRIBUTED TRANSCEIVER WITH DDFS CHANNEL SELECTION

CROSS-REFERENCE TO RELATED APPLICATIONS/INCORPORATION BY REFERENCE

This application makes reference to:
U.S. application Ser. No. 11/860,207 filed on Sep. 24, 2007;
U.S. application Ser. No. 11/860,251 filed on Sep.24, 2007;
U.S. application Ser. No. 11/860,269 filed on Sep. 24, 2007;
U.S. application Ser. No. 11/860,234 filed on Sep. 24, 2007; and
U.S. application Ser. No. 11/860,281 filed on Sep. 24, 2007.

Each of the above referenced applications is hereby incorporated herein by reference in its entirety.

FIELD OF THE INVENTION

Certain embodiments of the invention relate to signal processing for communication systems. More specifically, certain embodiments of the invention relate to a method and system for a distributed transceiver with DDFS channel selection.

BACKGROUND OF THE INVENTION

In 2001, the Federal Communications Commission (FCC) designated a large contiguous block of 7 GHz bandwidth for communications in the 57 GHz to 64 GHz spectrum. This frequency band was designated for use on an unlicensed basis, that is, the spectrum is accessible to anyone, subject to certain basic, technical restrictions such as maximum transmission power and certain coexistence mechanisms. The communications taking place in this band are often referred to as '60 GHz communications'.

With respect to the accessibility of this designated portion of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. For example, 60 GHz signals may provide markedly different communications channel and propagation characteristics, at least due to the fact that 60 GHz radiation is partly absorbed by oxygen in the air, leading to higher attenuation with distance. On the other hand, since a very large bandwidth of 7 GHz is available, very high data rates may be achieved. Among the applications for 60 GHz communications are wireless personal area networks, wireless high-definition television signal, for example from a set top box to a display, or Point-to-Point links.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for a distributed transceiver with direct digital frequency synthesis (DDFS) channel selection, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a distributed transceiver with DDFS channel selection. Aspects of a method and system for a distributed transceiver with DDFS channel selection may comprise frequency-translating a first signal to generate one or more second signals utilizing a distributed mixer and an in-phase and quadrature mixing stage. The first signal may be an input signal to the distributed mixer, which may comprise a plurality of frequency conversion stages. The input signal to the distributed mixer may be an input signal to at least one of the plurality of frequency conversion stages and an output signal of the distributed mixer may be generated from one or more output signals or the plurality of conversion stages. The output signal from the distributed mixer may be an input signal to the in-phase and quadrature mixing stage and the one or more second signals may be generated from one or more output signals of the in-phase and quadrature mixing stage.

The plurality of frequency conversion stages may be communicatively coupled in a cascade configuration. The first signal may be a radio frequency signal or an intermediate frequency signal and the one or more second signals may be baseband signals. The first signal may be a radio frequency signal or a baseband signal and the one or more second signals may be intermediate frequency signal. The first signal may be a baseband signal or an intermediate frequency signal and the one or more second signals may be radio frequency signals. In at least one of the plurality of frequency conversion stages, a first frequency scaled signal and a phase-shifted version of a second frequency scaled signal may be summed, where the first frequency scaled signal may be generated by multiplying a corresponding input signal with a local oscillator signal or a fractional local oscillator signal, and the second frequency scaled signal may be generated by multiplying the corresponding input signal with a phase-shifted version of the local oscillator signal or a phase-shifted version of the fractional local oscillator signal.

Figure 1:
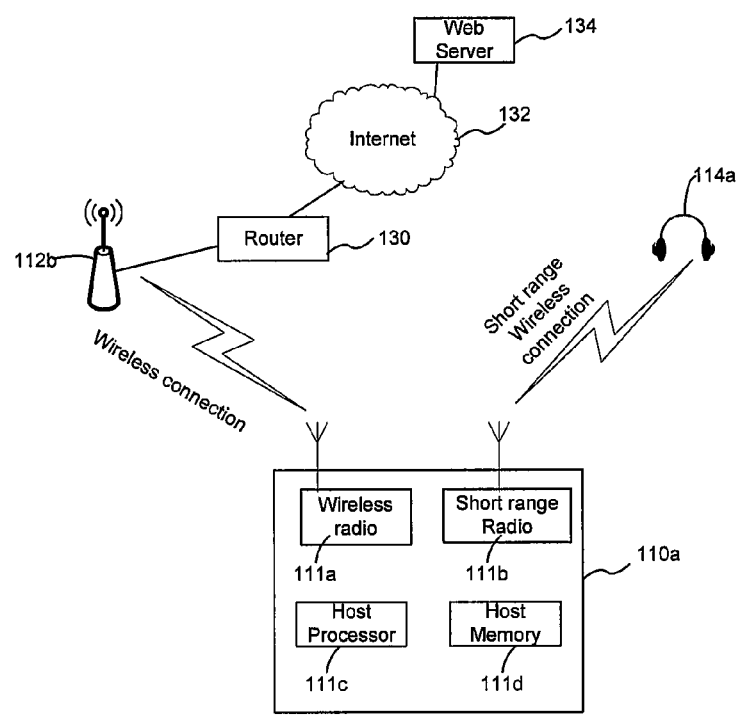
FIG. 1 is a diagram illustrating an exemplary wireless communication system, in connection with an embodiment of the invention.

FIG. 1 is a diagram illustrating an exemplary wireless communication system, in connection with an embodiment of the invention. Referring to FIG. 1, there is shown an access point 112b, a computer 110a, a headset 114a, a router 130, the Internet 132 and a web server 134. The computer or host device 110a may comprise a wireless radio 111a, a short-range radio 111b, a host processor 111c, and a host memory 111d. There is also shown a wireless. connection between the wireless radio 111a and the access point 112b, and a short-range wireless connection between the short-range radio 111b and the headset 114a.

Frequently, computing and communication devices may comprise hardware and software to communicate using multiple wireless communication standards. The wireless radio 111a may be compliant with a mobile communications standard, for example. There may be instances when the wireless radio 111a and the short-range radio 111b may be active concurrently. For example, it may be desirable for a user of the computer or host device 110a to access the Internet 132 in order to consume streaming content from the Web server 134. Accordingly, the user may establish a wireless connection between the computer 110a and the access point 112b. Once this connection is established, the streaming content from the Web server 134 may be received via the router 130, the access point 112b, and the wireless connection, and consumed by the computer or host device 110a.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications.

Figure 2:
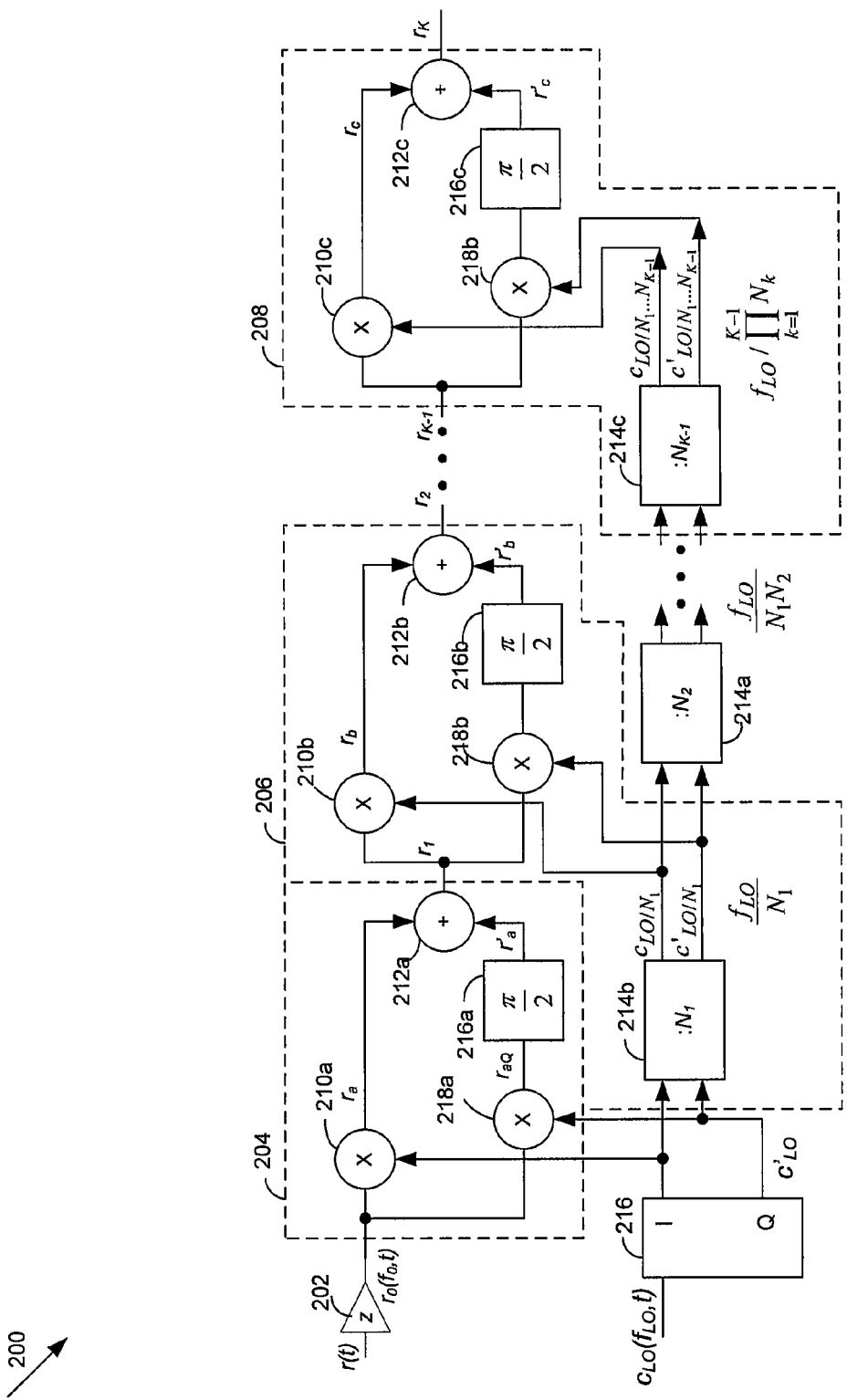
FIG. 2 is a block diagram of an exemplary RF demodulator for a high-frequency receiver, in accordance with an embodiment of the invention.

FIG. 2 is a block diagram of an exemplary RF demodulator for a high-frequency receiver, in accordance with an embodiment of the invention. Referring to FIG. 2, there is shown a demodulator 200 comprising an amplifier 202, a frequency divider 214a, a quadrature generator 216, and a plurality of down conversion stages, of which down conversion stages 204, 206 and 208 are illustrated. Down conversion stage 204 may comprise multipliers 210a and 218a, an adder 212a and a phase shifter 216a. Down conversion stage 206 may comprise multipliers 210b and 218b, adder 212b, a phase shifter 216b and a frequency divider 214b. Down conversion stage 208 may comprise multipliers 210c and 218c, adder 212c, a phase shifter 216c and a frequency divider 214c. There is also shown a received signal r(t) and an amplified received signal $r_0(f_0,t)=r_0=z\cdot r(t)$ that may be a function of a carrier frequency $f_0$ and time t and an amplification factor z due to amplification by the amplifier 202. The indices for frequency and time may be dropped for illustrative purposes. Similarly, there is shown $r_1, r_2, r_K, r_{K-1}, r_a, r_b, r_c, r'_a, r'_b, r'_c, r_{aQ}$. A local oscillator signal $c_{LO}$ ($f_{LO}, t)=c_{LO}$ and a number of frequency terms $$\frac{f_{LO}}{N_1}, \frac{f_{LO}}{N_1 N_2} \text{ and } \frac{f_{LO}}{\prod_{k=1}^{K} N_k}$$

may be shown, which may illustrate various signals generated by frequency dividing the local oscillator (LO) signal $c_{LO}$. For example, there is also shown a plurality of frequency-divided local oscillator signals, for example, $$c_{LO/N_1} = c_{LO/N_1}\left(\frac{f_0}{N_1}, t\right).$$

The amplifier 202 may comprise suitable logic, circuitry and/or code that may be enabled to amplify a high-frequency RF signal at its input by a factor z . The down conversion stages 204, 206 and 208 may be substantially similar and may comprise suitable logic, circuitry and/or code that may be enabled to down convert an input signal that may be modulated onto an RF carrier signal to an output signal that may be similar to the input signal but modulated onto a lower frequency carrier signal. The multipliers 210a/b/c and 218a/b/c may comprise suitable logic, circuitry and/or code that may be enabled to multiply two RF input signals and generate an RF output signal that may be proportional to the product of its input signals. The quadrature generator 216 and the phase shifter 216a/b/c may comprise suitable logic, circuitry and/or code that may be enabled to generate an output signal that may be a carrier phase-shifted version of an input signal. If the frequency of the envelope of the input signal is significantly smaller than the carrier frequency, the quadrature generator and/or phase shifters may substantially shift only the carrier component.

The quadrature generator may be, for example, coupled to an input signal $s(t)\cos(w_c t)$, where s(t) may represent the signal envelope and $\cos(w_c t)$ may be the carrier signal. If the highest significant frequency component in s(t) is significantly smaller than $w_c$, the in-phase output signal of the quadrature generator may be $s(t)\cos(w_c t)$ and the quadrature output of the quadrature generator may be $s(t)\cos(w_c t+\pi/2)$, for example. In some instances, for example due to a different implementation of the quadrature generator, the in-phase output signal of the quadrature generator may be $s(t)\cos(w_c t-\pi/4)$ and the quadrature output of the quadrature generator may be $s(t)\cos(w_c t+\pi/4)$. Hence, the output signals may be, for example, 90 degrees phase-shifted in the carrier. Any combination phase shifts between the in-phase and quadrature carrier that may be 90 degrees ($\pi/2$) may be suitable, in accordance with various embodiments of the invention. For illustrative purposes, the in-phase output may be considered equal to the input signal and the quadrature signal may be considered 90 degrees phase shifted from the input signal. In some instances, a frequency divider may also be used to provide quadrature and in-phase output signals as described above. For example, if the input signal has a 50-50 duty cycle, the output signal of a flip-flop frequency divider may provide quadrature outputs as described above. Phase shifters, for example phase shifters 216a/b/c, may generate an output signal that may be similar to the phase shifted input signal. Similarly to the quadrature generator, a phase shifter may essentially generate a carrier-shifted output signal if the highest significant frequency component in the signal envelope is much smaller than the carrier frequency. In some instances, phase shifters may be used additionally to phase synchronize various signals. The adders 212a/b/c may comprise suitable logic, circuitry and/or code that may be enabled to sum a plurality of input signals into an output signal. The frequency dividers 214a/b/c may comprise suitable logic, circuitry and/or code that may be enabled to generate an output signal that may be similar to its input signal, divided in frequency. The frequency dividers may be implemented using Direct Digital Frequency Synthesis or integer (Miller) dividers, for example.

With reference to FIG. 2, there is shown a demodulator 200 that may be part of a high-frequency radio frequency receiver. An exemplary high-frequency received signal may be $r(f_0,t) = s_I(t)\cos(2\pi f_0 t) + s_Q(t)\sin(2\pi f_0 t) = s_I(t)\cos(w_0 t) + s_Q(t)\sin(w_0 t)$, where $f_0$ may be the carrier frequency and $2\pi f_0 = w_0$ may be the corresponding angular frequency. The signals $s_I(t)$ and $s_Q(t)$ may be, for example, the information-bearing in-phase and quadrature baseband signals that may be modulated onto the carrier $\cos(w_0 t)$ and $\sin(w_0 t)$. In some instances, the received signal r(t) may be at a high carrier frequency, for example, $f_0=60$ GHz. In these instances, it may be difficult to generate a local oscillator signal $c_{LO}$, for example with a Phase-locked loop (PLL), sufficiently high in frequency to achieve demodulation to baseband or, in some instances, to an intermediate frequency. In addition, high frequency LO signals may generally be undesirable for distribution in a system since the signal transport over conductors may result in transmission line problems, due to the LO signal's high frequency content. Hence, it may be desirable to generate the high frequency signal for demodulation of the RF signal in proximity to the received high frequency signal $r(f_0,t)$. In these instances, it may be desirable to generate a local oscillator signal $c_{LO}$ that may be significantly lower in frequency, for example, $f_{LO}=20$ GHz, than the carrier of the received signal at, for example, $f_0=60$ GHz. In accordance with various embodiments of the invention, a plurality of conversion stages, for example down conversion stages 204, 206 and 208 may then be used to down convert the received signal r(t) to baseband and/or intermediate frequency.

An exemplary received signal r(t) may be amplified by a factor z in the amplifier 202 to generate a signal at the input to the multiplier 210a, given by $r_0(f_0,t) = z \cdot r(f_0,t) = z \cdot [s_I(t)\cos(w_0 t) + s_Q(t)\cos(w_0 t)]$. The multiplier 210a may multiply the signals $r_0$ with the local oscillator signal $c_{LO} = \cos(w_{LO}t)$, to generate $r_a$ according to the following relationship:

$$r_a = r_0(f_0, t) c_{LO}(f_0, t)$$
$$= z \cdot [s_I(t)\cos(w_0 t) + s_Q(t)\sin(w_0 t)]\cos(w_{LO}t)$$
$$= \frac{z}{2} \cdot s_I(t)[\cos(w_0 t + w_{LO}t) + \cos(w_0 t - w_{LO}t)] +$$
$$\frac{z}{2} s_Q(t)[\sin(w_0 t + w_{LO}t) + \sin(w_0 t - w_{LO}t)]$$

Hence, as may be seen from the above equation, the signal $r_a$ may comprise sum and difference terms at frequencies determined by the difference of the carrier frequency $w_0$ and the local oscillator frequency $w_{LO}$. In this instance, in accordance with an embodiment of the invention, it may be desirable to demodulate the received signal r(t) and hence it may be desirable to retain only the lower frequency component, modulated onto a carrier at frequency $w_0-w_{LO}$. This may be achieved by adding a signal $r'_a$ to signal $r_a$, wherein $r'_a$ is a signal that may be generated by multiplying $r_0$ with a quadrature carrier and phase-shifting, as given by the following relationship:

$$r_{aQ} = r_0 c'_{LO}$$
$$= z \cdot [s_I(t)os(w_0 t) + s_Q(t)\sin(w_0 t)]\sin(w_{LO}t)$$
$$= \frac{z}{2} \cdot s_I(t)[\sin(w_0 t + w_{LO}t) - \sin(w_0 t - w_{LO}t)] +$$
$$\frac{z}{2} s_Q(t)[\cos(w_0 t - w_{LO}t) - \cos(w_0 t + w_{LO}t)]$$

The signal $r_{aQ}$ may then be phase shifted in the phase shifter 216a by $\pi/2$, for example, to generate $r'_a$, as given by the following relationship:

$$r'_a = \frac{z}{2} \cdot s_I(t)[\cos(w_0 t + w_{LO}t) - \cos(w_0 t - w_{LO}t)] +$$
$$\frac{z}{2} s_Q(t)[\sin(w_0 t + w_{LO}t) - \sin(w_0 t - w_{LO}t)]$$

Hence, the output of adder 212a, $r_1$ may be generated from the following relationship $$r_1 = r_a - r'_a = z[s_I(t)\cos(w_0 t - w_{LO}t) + s_Q(t)\sin(w_e t - w_{LO}t)]$$

, which may reject the higher of the frequency terms to generate $r_1$.

In an additional down conversion stage, for example down conversion stage 206, the generated signal $r_1$, may be down converted further. This may be achieved in a similar manner by down converting $r_1$ with a frequency-divided local oscillator signal. Specifically, as illustrated in FIG. 2, the down converted output signal $r_1$ from down conversion stage 204 may be multiplied in multiplier 210b with a signal that may be a frequency divided version of the local oscillator at the output of the frequency divider 214b, namely $$c_{LO/N_1} = \cos\left(\frac{w_{LO}}{N_1}t\right).$$

The divisor, $N_1$, applied in frequency divider 214b may be arbitrary. In many instances, it may be desirable to choose $N_1$ a rational number or an integer.

Similar to generating $r_1$, $r_2$ at the output of the down conversion stage 206 may be generated by adding a suitable signal $r'_b$ to $r_b$ in adder 212b, which may remove the higher frequency component. The signal $r_b$ may be given by the following relationship:

$$r_b = r_1 \cdot c_{LO/N_1}$$
$$= z \cdot [s_I(t)\cos(w_0 t - w_{LO}t) + s_Q(t)\sin(w_0 t - w_{LO}t)]\cos\left(\frac{w_L}{N_1}t\right)$$
$$= \frac{z}{2} \cdot s_I(t)\left[\cos\left(w_0 t - w_{LO}t + \frac{w_L}{N_1}t\right) + \cos\left(w_0 t - w_{LO}t - \frac{w_L}{N_1}t\right)\right] +$$
$$\frac{z}{2} s_Q(t)\left[\sin\left(w_0 t - w_{LO}t + \frac{w_L}{N_1}t\right) + \sin\left(w_0 t - w_{LO}t - \frac{w_L}{N_1}t\right)\right]$$

Correspondingly, $r'_b$ may be given by the following relationship:

$$r'_b = \frac{z}{2} \cdot s_I(t) \left[ \cos\left(w_0 t - w_{LO}t + \frac{w_{LO}t}{N_1}\right) - \cos\left(w_0 t - w_{LO}t - \frac{w_{LO}t}{N_1}\right) \right] + \frac{z}{2} s_Q(t) \left[ \sin\left(w_0 t - w_{LO}t + \frac{w_{LO}t}{N_1}\right) - \sin\left(w_0 t - w_{LO}t - \frac{w_{LO}t}{N_1}\right) \right]$$

Hence, $r_2$ may be given by the following relationship:

$$r_2 = r_b - r'_b \quad (1)$$

$$= z \begin{bmatrix} s_I(t)\cos\left(w_0 t - w_{LO}t - \frac{w_{LO}}{N_1}t\right) + \\ s_Q(t)\sin\left(w_0 t - w_{LO}t - \frac{w_{LO}}{N_1}t\right) \end{bmatrix}$$

Further down modulating may be achieved by applying further down conversion stages, similar to down conversion stage 206, for example. As illustrated in FIG. 2, it may be desirable to use a cascade of K down conversion stages. In this case, the output signal $r_K$ after K down conversion stages may be given, for example, by the following relationship:

$$r_K = z \begin{bmatrix} s_I(t)\cos\left(w_0 t - w_{LO}\left(1 + \sum_{k=1}^{K-1} \frac{1}{\prod_{n=1}^{k} N_n}\right)t\right) + \\ s_Q(t)\sin\left(w_0 t - w_{LO}\left(1 + \sum_{k=1}^{K-1} \frac{1}{\prod_{n=1}^{k} N_n}\right)t\right) \end{bmatrix} \quad (2)$$

In these instances, it may be that the adders 212 in the down conversion stages, for example adders 212*a/b/c* may be configured in order to attenuate the higher frequency component at their input. In this instance, $N_k > 0 \forall k \in 1, 2, \ldots K-1$.

In some instances and for some down conversion stages, it may be desirable to choose to retain the higher frequency component rather than the lower frequency component of the output signal of the multiplier, in order to get a desirable output at the filter. For example, in accordance with various embodiments of the invention, the higher frequency component in $r_b$, equation (1), for example, may be retained by subtracting $-r'_b$ from $r_b$ in adder 212*b*. In this instance, from equation (1), $r_2$ may be given by the following relationship:

$$r_2 = r_b + r'_b \quad (3)$$

$$= z \begin{bmatrix} s_I(t)\cos\left(w_0 t - w_{LO}t + \frac{w_{LO}}{N_1}t\right) + \\ s_Q(t)\sin\left(w_0 t - w_{LO}t + \frac{w_{LO}}{N_1}t\right) \end{bmatrix}$$

In a general case, either the higher or the lower frequency component may be selected to be retained for each down conversion stage. As illustrated in equation (3), this may result in the sign of the frequency term corresponding to a particular down conversion stage to change. Hence, for K down conversion stages, the output $r_K$ may be described by equation (2), wherein the coefficients $N_k$ may be positive or negative, as appropriate.

In one embodiment of the invention, the divisors $N_k$ may be chosen equal, so that $N_k = N \forall k$. In these instances, equation (2) may be given by the following relationship:

$$r_K = z \begin{bmatrix} s_I(t)\cos\left(w_0 t - w_{LO}\sum_{k=1}^{K-1}\left(\frac{1}{N}\right)^k\right) + \\ s_I(t)\sin\left(w_0 t - w_{LO}\sum_{k=1}^{K-1}\left(\frac{1}{N}\right)^k\right) \end{bmatrix} \quad (4)$$

It may be observed that the expression in equation (4) may be stable and converge for an arbitrary number of stages when $|1/N|<1$, so that the limit of (4) may be given by the following relationship, from equation (4):

$$r_K \Big|_{z=1} \xrightarrow{K \to \infty} s_I(t)\cos\left(w_0 t - \frac{N \cdot w_{LO}t}{N-1}\right) + s_Q(t)\sin\left(w_0 t - \frac{N \cdot w_{LO}t}{N-1}\right) \quad (5)$$

where equation (5) may converge more rapidly for larger N. For example, if N=4, the frequency term in equation (5) may converge to $w_0 t - 1.\overline{3} \cdot w_{LO}t$ as $K \to \infty$. However, as may be observed from the first line of equation (5), with K=3, the frequency term may already be $w_0 t - 1.3125 \cdot w_{LO}t$ and hence the frequency correction term may be approximately $$\frac{1.3125}{1.\overline{3}} = 63/64 \approx 98.5\%$$

of the desired frequency correction term.

In accordance with various embodiments of the invention, the number of down conversion stages may be arbitrary. Moreover, in some instances, it may be desirable that the first down conversion stage, for example down conversion stage 204 may comprise a frequency divider, similar, for example, to down conversion stage 206 and/or down conversion stage 208. The number of down conversion stages K may be determined, for example, based on the difference between $w_0$ and $w_{LO}$, and the desired intermediate frequencies. In some instances, it may be possible that the divisors may be software-programmable. Moreover, the structure illustrated in FIG. 2 may be used by a modulator, whereby the sum terms instead of the difference terms may be retained in order to obtain an output signal at a higher frequency that the input signal. For example, in equation (1), the higher frequency component may be retained by the adder 212*b* in the down conversion stage 206, whereby the down conversion stage 206 may effectively become an up conversion stage, as illustrated in equation (3).

Figure 3:
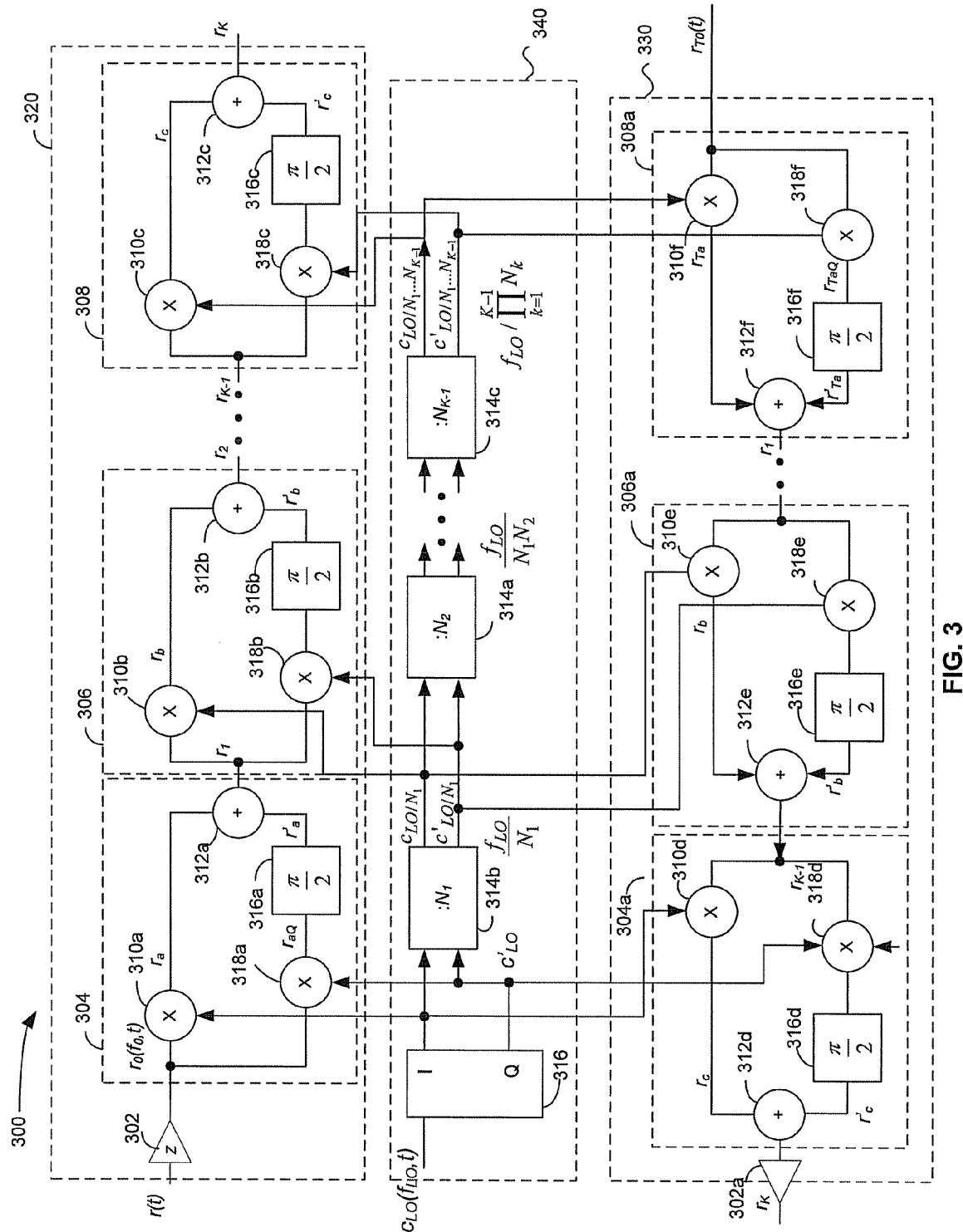
FIG. 3 is a block diagram of an exemplary RF modulator and demodulator for a high-frequency transceiver, in accordance with an embodiment of the invention.

FIG. 3 is a block diagram of an exemplary RF modulator and demodulator for a high-frequency transceiver, in accordance with an embodiment of the invention. Referring to FIG. 3, there is shown a modulator/demodulator system 300 comprising a demodulator 320, a fractional LO cascade 340, and a modulator 330. The demodulator 320 may be substantially similar to the demodulator 200 illustrated in FIG. 2, whereby the frequency dividers may be part of the fractional LO cascade 340. The elements of demodulator 320 may be similar to their corresponding elements in demodulator 200. Specifically, elements 302, 304, 306, 308, 310*a/b/c*, and 312*a/b/c* may be similar to elements 202, 204, 206, 208, 210*a/b/c*, and 212*a/b/c*, respectively.

The fractional LO cascade 340 may comprise a quadrature generator 316 and a plurality of frequency dividers, of which frequency dividers 314a, 314b and 314c may be illustrated. The quadrature generator 316 and the frequency dividers 314a/b/c may be substantially similar to the quadrature generator 216 and the frequency dividers 214a/b/c, as illustrated in FIG. 2.

The modulator 330 may comprise an amplifier 302a, and a plurality of up conversion stages, of which up conversion stages 304a, 306a and 308a may be illustrated. The modulator 330 may comprise suitable logic, circuitry and/or code that may be enabled to modulate an input signal, $r_{T0}$, to radio frequency and/or intermediate frequency, $r_{TK}$. The signal subscript 'T' may indicate a transmit signal associated with the modulator 330. The up conversion stage 304a, 306a and 308a may comprise adders 312d/e/f, and multipliers 310d/e/f and 318d/e/f, respectively. There is also shown a transmit signal $r_{T0}(f_{T0},t)=r_{T0}$ that may be a function of frequency $f_{T0}$ and time t. The indices for frequency and time may be dropped for illustrative purposes. Similarly, there is shown $r_{T1}, r_{T(K-1)}, r_{TK}$, which may be the output signals of up conversion stages 1,(K−1) and K, respectively. There are also shown the signals $r_{Ta}, r_{TaQ}$ and $r'_{Ta}$ to the adder 312f of the up conversion stage 308a.

The functionality of the modulator 330 may be considered similar to the demodulator 320 functionality in reverse. In particular, whereas in the demodulator 320, the input signal $r_0$ may be a signal modulated onto a radio frequency carrier or an intermediate frequency carrier for frequency translation to a lower frequency, the input signal of the modulator 330, $r_{T0}$ may be a baseband signal or an intermediate frequency signal for frequency translation to a higher frequency, for example to intermediate frequency or radio frequency, respectively. However, the frequency up conversion may be achieved similarly to the frequency down conversion. The main difference may be found in the addition that may be performed at the adders 312d/e/f, wherein the higher frequency components may be retained, as described for equation (3) and FIG. 2 above. For example, in up conversion stage 308a, the output signal $r_{T1}$ may found from the following relationship:

$$r_{Ta} = r_{T0} \cdot c_{LO/(N_1 \cdot N_2 \cdot \ldots \cdot N_{K-1})} \quad (6)$$

$$= [x_I(t)\cos(w_{T0}t) + x_Q(t)\sin(w_{T0}t)]\cos\left(\frac{w_{LO}}{\prod_{k=1}^{K-1} N_k}t\right)$$

$$= \frac{1}{2}x_I(t)\left[\cos\left(w_{T0}t - \frac{w_{LO}}{\prod_{k=1}^{K-1} N_k}t\right) + \cos\left(w_{T0}t - \frac{w_{LO}}{\prod_{k=1}^{K-1} N_k}t\right)\right] +$$

$$\frac{1}{2}x_Q(t)\left[\sin\left(w_{T0}t - \frac{w_{LO}}{\prod_{k=1}^{K-1} N_k}t\right) + \sin\left(w_{T0}t - \frac{w_{LO}}{\prod_{k=1}^{K-1} N_k}t\right)\right]$$

where $w_{T0}=2\pi f_{T0}$ may be the angular frequency of the input signal $r_{T0}=x(t)\cos(w_{T0}t)$, wherein $x_I(t)$ and $x_Q(t)$ may be the information bearing in-phase baseband signal and the quadrature baseband signal, respectively (or, in some instances, intermediate frequency) signal, similar to s(t) for the received signal. Similarly, as described for FIG. 2, the signal $r_{TaQ}$ may be given by the following relationship:

$$r_{TaQ} = r_{T0} c'_{LO/N_1 \ldots N_{K-1}}$$

$$= \frac{1}{2}x_I(t)\left(\sin\left(w_{T0}t + \frac{w_{LO}}{\prod_{k=1}^{K-1} N_k}t\right) - \sin\left(w_{T0}t - \frac{w_{LO}}{\prod_{k=1}^{K-1} N_k}t\right)\right)$$

$$\frac{1}{2}x_Q(t)\left(\cos\left(w_{T0}t + \frac{w_{LO}}{\prod_{k=1}^{K-1} N_k}t\right) - \cos\left(w_{T0}t - \frac{w_{LO}}{\prod_{k=1}^{K-1} N_k}t\right)\right)$$

By phase shifting $r_{TaQ}$ by 90 degrees, $r'_{Ta}$ may be obtained, given by the following relationship:

$$r'_{Ta} = \frac{1}{2}x_I(t)\left[\cos\left(w_{T0}t + \frac{w_{LO}}{\prod_{k=1}^{K-1} N_k}t\right) - \cos\left(w_{T0}t - \frac{w_{LO}}{\prod_{k=1}^{K-1} N_k}t\right)\right] +$$

$$\frac{1}{2}x_Q(t)\left[\sin\left(w_{T0}t + \frac{w_{LO}}{\prod_{k=1}^{K-1} N_k}t\right) - \sin\left(w_{T0}t - \frac{w_{LO}}{\prod_{k=1}^{K-1} N_k}t\right)\right]$$

Hence, retaining the higher frequency component may be achieved in $r_{T1}$ by forming the sum given by the following relationship:

$$r_{T1} = r_{Ta} + r'_{Ta} \quad (7)$$

$$= x_I(t)\cos\left(w_{T0}t + \frac{w_{LO}}{\prod_{k=1}^{K-1} N_k}t\right) + x_Q(t)\sin\left(w_{T0}t + \frac{w_{LO}}{\prod_{k=1}^{K-1} N_k}t\right)$$

Similar to FIG. 2, the adder 312f may be an adjustable and may retain, for example, the lower and/or higher frequency components comprised in its input signal, and may not be limited to the expression provided in equation (7).

In accordance with an embodiment of the invention, the modulator 330 may share the fractional LO cascade 340 outputs with the demodulator 320. The modulator 330 may be configured in a manner that may provide the same up conversion frequency steps that may be provided in the down conversion. In particular, if the adder in a down conversion stage may retain the lower frequency component, by retaining the higher frequency component in the corresponding up conversion stage, the up conversion signal may be upconverted in frequency by the same amount as a down conversion signal may be downconverted in frequency by the corresponding down conversion stage. For example, as described for FIG. 2, the received signal $r_0$ may be down converted from angular frequency $w_0$ to $w_1=w_0-w_{LO}$ for signal $r_1$ in down conversion stage 304. Similarly, the signal $r_{T(K-1)}$ at angular frequency $W_{T(K-1)}$ may be converted by the corresponding up conversion stage 304a to angular frequency $w_{TK}=w_{T(K-1)}+w_{LO}$. Hence, by appropriately choosing the adders in both the demodulator 320 and the modulator 330, the frequency translation across the entire modulator may be chosen approximately equal across the entire demodulator, for example, in opposite directions. In one exemplary embodiment of the invention, the received signal $r_0$, for example, may be down converted by 40 GHz from $r_0$ to $r_K$, and the transmit signal $r_{T0}$ may be up converted by 40 GHz from at $r_{T0}$ to $r_{TK}$.

Figure 4:
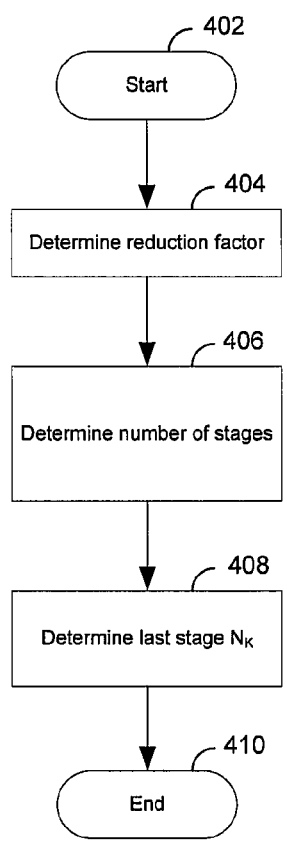
FIG. 4 is a flowchart, illustrating an exemplary determination of the down conversion factors of a demodulator, in accordance with an embodiment of the invention.

FIG. 4 is a flowchart, illustrating an exemplary determination of the down conversion factors of a demodulator, in accordance with an embodiment of the invention. In accordance with the description for FIG. 2 and FIG. 3, it is understood by one skilled in the art that there are a large number of approaches that may be chosen to determine a number of frequency conversion stages and appropriate frequency conversion factors. With reference to FIG. 4, there is shown one approach that may be used to determine a number of frequency conversion stages and the associated conversion factors and/or divisors.

In accordance with an exemplary embodiment of the invention, determination of a down conversion system, for example a demodulator similar to FIG. 2, may be illustrated in FIG. 4. Initially, in step 404, a reduction factor may be determined. The reduction factor, for example x, may be determined by the difference between the frequency of the carrier of the received signal, $w_0$, and the desired carrier frequency at the output of the demodulator, $w_K$. The reduction factor may be expressed in terms of local oscillator frequency, as given by the following relationship:

$$x = \frac{w_0 - w_K}{w_{LO}}$$

Based on the reduction factor, the number of stage stages according to this exemplary approach may be determined as given by the following relationship, in step 406:

$$K = \lceil x \rceil$$

where the operation $\lceil . \rceil$ may denote 'the nearest greater integer'. In this instance, for K conversion stages, K−1 conversion stages may be chosen such that $N_k = 1 \, \forall k \in 0, 1, \ldots K−1$. The down conversion factor $N_K$ of the K-th down conversion stage may correspondingly be chosen, in step 408, as $0 < N_K < 1$ and may be given by the following relationship:

$$N_K \approx \frac{1}{x - \lfloor x \rfloor}$$

where the operation $\lfloor . \rfloor$ may denote 'the nearest smaller integer', and the operation '≈' may be interpreted as 'a sufficiently close rational number', in accordance with the accuracy that may be required in the system.

In an exemplary embodiment of the invention, in instance where $w_0$ may be 60 GHz, the target frequency $w_K$ may be 1 GHz, and the local oscillator frequency $w_{LO}$ may be 8 GHz, x=7.375. Hence, it may be desirable to use K=8 stages. Hence, $N_k = 1 \, \forall k \in 0, 1, \ldots 6$ and $$N - K - 1 = 0.375 = \frac{3}{8}.$$

Figure 5:
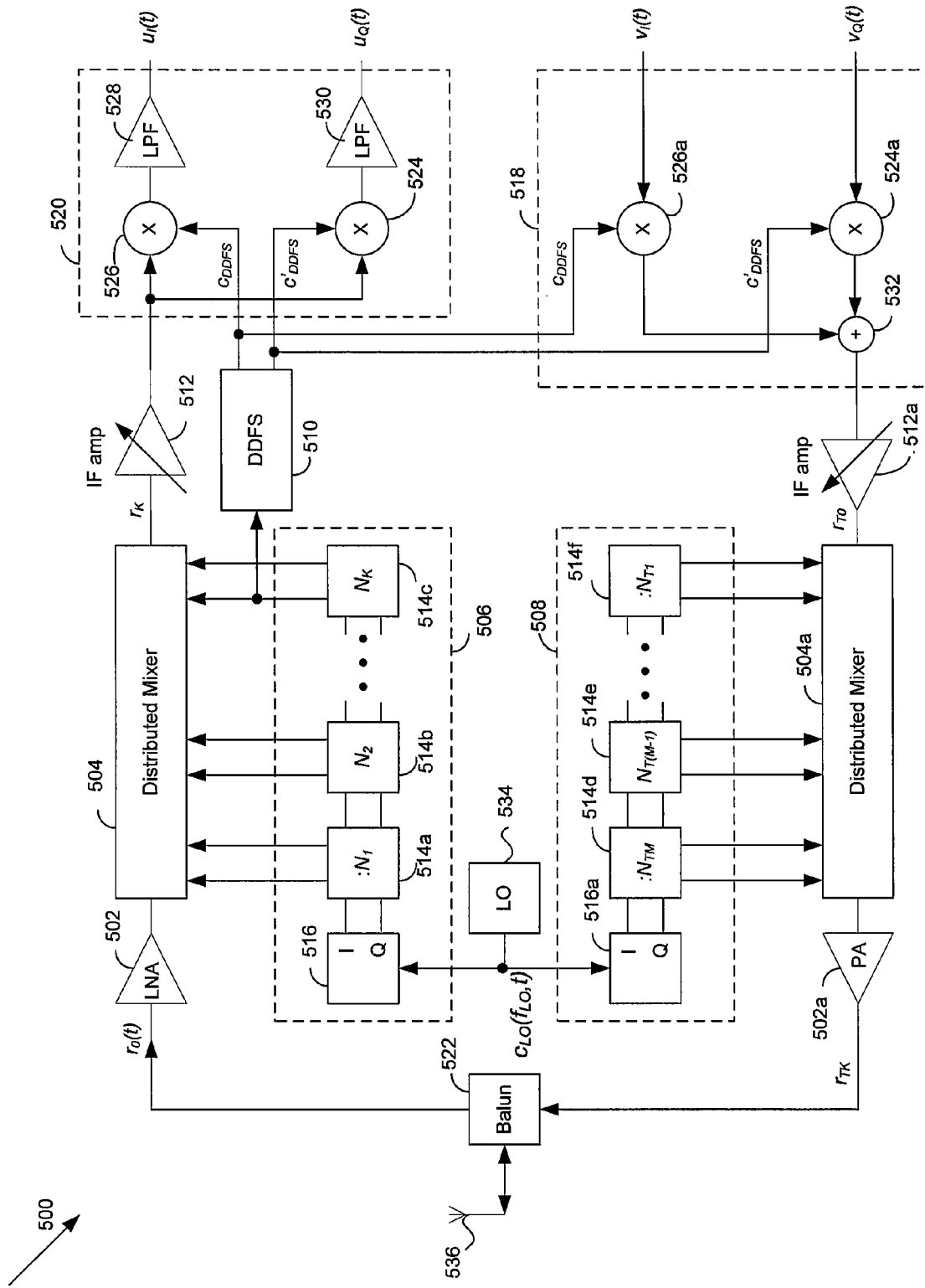
FIG. 5 is a diagram of an exemplary distributed modulator and demodulator with DDFS channel selection, in accordance with an embodiment of the invention.

FIG. 5 is a diagram of an exemplary distributed modulator and demodulator with DDFS channel selection, in accordance with an embodiment of the invention. Referring to FIG. 5, there is shown a transceiver system 500 comprising amplifiers 502, 502a, 512 and 512a, distributed mixers 504 and 504a, an antenna 536, a balun 522, a local oscillator 534, fractional LO cascades 506 and 508, a Direct Digital Frequency Synthesizer (DDFS) 510, and I/Q mixer stages 520 and 518. The fractional LO cascade 506 may comprise a quadrature generator 516, and a plurality of frequency dividers, of which frequency dividers 514a, 514b and 514c may be illustrated. The fractional LO cascade 508 may comprise a quadrature generator 516a, and a plurality of frequency dividers, of which frequency dividers 514d, 514e and 514f may be illustrated. The I/Q mixer stage 520 may comprise low-pass filters (LPF) 528 and 530, and multipliers 524 and 526. The I/Q mixer stage 518 may comprise multipliers 526a and 524a, and adder 532. With reference to FIG. 5, there is also shown a received signal $r_0(f_0, t) = r_0(t) = r_0$, an intermediate frequency (IF) signal $r_K$, a in-phase baseband received signal $u_I(t)$, a quadrature baseband received signal $u_Q(t)$, a DDFS in-phase oscillator signal $c_{DDFS}$ and a DDFS quadrature oscillator signal $c'_{DDFS}$, a local oscillator signal $c_{LO}(f_0, t) = c_{LO}$, a transmit signal $r_{TK}$, an IF transmit signal $r_{T0}$, a in-phase baseband transmit signal $v_I(t)$ and a quadrature baseband transmit signal $v_Q(t)$.

A radio frequency signal $r_0(t)$ may be received at the antenna 536. The antenna 536 may be communicatively coupled to the balun 522. The balun 522 may comprise suitable logic, circuitry and/or code that may be enabled to convert a balanced signal to an unbalanced signal and vice versa. The balun 522 may, for example, comprise one or more inductors and may use the transformer principle to convert between unbalanced and balanced lines from the antenna to the receiver and/or transmitter and vice versa. The received signal $r_0(t)$, after suitable transformation in the balun 522, may be communicatively coupled to the amplifier 502. The amplifier 502 may be, for example, a low-noise amplifier (LNA) for RF signals and may comprise suitable logic, circuitry and/or code that may be enabled to generate an output signal that may be its amplified input signal. The amplifiers 502a, 512, 512a, 528 and 530 may be substantially similar in functionality to amplifier 502. The output of the low-noise amplifier 502 may be communicatively coupled to the distributed mixer 504. The distributed mixer 504 may comprise suitable logic, circuitry and/or code that may be enabled to down-convert the input signal received from the amplifier 502 in frequency to an intermediate frequency signal $r_K$. The distributed mixer 504 may be substantially similar to the demodulator 320, for example. Similar to the demodulator 320, the distributed mixer 504 may be communicatively coupled to various local oscillator signals and fractional local oscillator signals that may be provided by the fractional LO cascade 506. The fractional LO cascade 506 may comprise suitable logic, circuitry and/or code that may be enabled to accept a local oscillator input $c_{LO}$ from the local oscillator 534 and may generate various local oscillator and fractional local oscillator outputs, as well as phase-shifted versions thereof. The fractional LO cascade 506 may be substantially similar to the fractional LO cascade 340 in FIG. 3. The local oscillator 534 may be generating a local oscillator signal that may be, for example, a sinusoidal local oscillator signal and may, for example, be implemented with a phase-locked loop.

As described for FIG. 2 and FIG. 3, the distributed mixer 504 may be used to down-convert the RF signal $r_0(t)$ at a very high carrier frequency, for example, $f_0 = 60$ GHz, to an intermediate frequency, for example $f_K = 1$ GHz. The distributed mixer 504 may be particularly suitable for large frequency down-conversion to an intermediate frequency. The IF signal $r_K$ may be communicatively coupled from the distributed mixer 504 to an IF amplifier 512. The IF amplifier 512 may comprise suitable logic, circuitry and/or code that may be enabled to amplify the intermediate frequency signal before further processing in the I/Q mixer stage 520. The I/Q mixer stage 520 may comprise suitable logic, circuitry and/or code that may be enabled to convert an IF input signal $r_K$ to an in-phase baseband received signal $u_I(t)$ and a quadrature baseband received signal $u_Q(t)$.

The intermediate frequency signal may be given, for example, by the following relationship:

$$r_K = s_I(t)\cos(w_K t) + s_Q(t)\sin(w_K t)$$

where $w_K$ may be the angular intermediate frequency and $s_I(t)$ and $s_Q(t)$ may be the information-bearing in-phase and quadrature baseband signals. The signal $r_K$ may be communicatively coupled from the amplifier 512 to the multiplier 526. The multipliers 526 and 524 may comprise suitable logic, circuitry and/or logic that may be enabled to multiply an intermediate frequency input signal with an oscillator signal to generate an output signal that may be proportional to the product of the two input signals. For example, the multiplier 526 may generate the output signal $u_I(t)$, which may be filtered and amplified in the LPF 528. The in-phase baseband received signal $u_I(t)$ may be described by the following relationship, generated by multiplying the intermediate frequency signal $r_K$ with an oscillator signal $c_{DDFS} = \cos(w_D t)$:

$$u_I(t) = \cos(w_D t) r_K \quad (8)$$
$$= \frac{s_I(t)}{2}[\cos(w_K t + w_D t) + \cos(w_K t - w_D t)] +$$
$$\frac{s_Q(t)}{2}[\sin(w_K t + w_D t) + \sin(w_K t - w_D t)]$$

$$u_I(t)|_{w_D = w_K} = LPF_{528}\left(\begin{array}{c} \frac{s_I(t)}{2}[1 + \cos(w_K t + w_D t)] + \\ \frac{s_Q(t)}{2}\sin(w_K t + w_D t) \end{array}\right)$$
$$= \frac{s_I(t)}{2}$$

In accordance with an embodiment of the invention, the I/Q mixer stage 520 may down-convert the IF signal to baseband. In these instances, the frequency down-conversion frequency of $c_{DDFS}$ may be chosen as $w_D = w_K$, so that a desired channel that may be located around intermediate frequency $w_K$ may be brought to baseband. In these instances, the quadrature component at baseband may be eliminated, as illustrated in equation (8). In order to retain the in-phase information bearing signal $s_I(t)$, the output of the multiplier 526 may be passed through the low-pass filter 528. The low-pass filter 528 may comprise suitable logic, circuitry and/or code that may be enabled to attenuate certain high frequency components from its input signal. In particular, the low pass filter 528 may be used to suppress neighboring channels and the high-frequency components at $w_K + w_D$, as illustrated in equation (8).

Similarly, the quadrature baseband received signal $u_Q(t)$ may be generated from the intermediate frequency signal $r_K$ by multiplying with a quadrature oscillator signal $c'_{DDFS} = \sin(w_D t)$ in multiplier 524. The output of the multiplier 524 may be communicatively coupled to the low-pass filter 530, which may be used to attenuate any undesired frequency components. The quadrature baseband signal $u_Q(t)$ may accordingly be given by the following relationship:

$$u_Q(t) = \sin(w_D t) r_K$$
$$= \frac{s_I(t)}{2}[\sin(w_K t + w_D t) - \sin(w_K t - w_D t)] +$$
$$\frac{s_Q(t)}{2}[\cos(w_K t - w_D t) - \cos(w_K t + w_D t)]$$

$$u_Q(t)|_{w_D = w_K} = LPF_{530}\left(\begin{array}{c} \frac{s_I(t)}{2}\sin(w_K t + w_D t) + \\ \frac{s_Q(t)}{2}\sin[1 - \cos(w_K t + w_D t))] \end{array}\right)$$
$$= \frac{s_Q(t)}{2}$$

The oscillator signals $c_{DDFS}$ and $c'_{DDFS}$ may be generated in the DDFS 510. The DDFS 510 may comprise suitable logic, circuitry and/or code that may be enabled to generate one or more variable frequency local oscillator signals at the output. The DDFS 510 may be clocked by a local oscillator signal that may be provided, for example, by one of the outputs of the fractional LO cascade 506. It may be desirable that the oscillator frequency that may clock the DDFS may be approximately 2 or more times higher than the required output frequency. For example, to generate $c'_{DDFS} = \sin(w_D t)$, the clocking frequency may be, for example, $5w_D$. The DDFS 510 may be programmed to generate oscillator signals with arbitrary output frequencies in the range of approximately 0 Hz to approximately half of the clocking frequency. In addition, the DDFS 510 may permit very precise frequency outputs and very fast changes between frequencies. For these reasons, generating the oscillator signals $c_{DDFS}/c'_{DDFS}$ in the DDFS 510 may permit very precise tuning and fast changes in the output frequencies. In some instances, the desired received signal may use multiple channels and the DDFS 510 outputs may be programmed to down-convert for a specific frequency channel without a need to reprogram the distributed mixer 504 or the fractional LO cascade 506. In another embodiment of the invention, the received signal may be a frequency hopping signal that may change channel frequency in short time intervals. In addition, the DDFS 510 may be used to calibrate and fine-adjust any frequency offsets that may be introduced into the system, for example due to operating temperature fluctuations, or manufacturing variances in components. For example, the distributed mixer 504 may be used to down-convert a received signal $r_0(f_0,t)$ from a carrier frequency of, for example, $f_0 = 60$ GHZ to an intermediate frequency of, for example, $f_K = 2$ GHz. The DDFS 510 output oscillator signals $c_{DDFS}/c'_{DDFS}$ may be used to down-convert from the intermediate frequency to the baseband frequency, as described above.

To generate a radio frequency transmit signal, an in-phase baseband transmit signal $v_I(t)$ and a quadrature baseband transmit signal $v_Q(t)$ may be communicatively coupled to the I/Q mixer stage 518. The I/Q mixer stage 518 may comprise suitable logic, circuitry and/or code that may be enabled to modulate the in-phase baseband transmit signal and the quadrature baseband signal to intermediate frequency and sum them. The in-phase baseband transmit signal $v_I(t)$ may be multiplied with an in-phase carrier signal $C_{DDFS}$ in multiplier 526a. Similarly, the quadrature baseband transmit signal $v_Q(t)$ may be multiplied with a quadrature carrier signal $C'_{DDFS}$ in multiplier 524a. The outputs of the multiplier 526a and 524a may be summed in the adder 532 to generate, for example, the signal $r_{T0}$, which may be given by the following relationship:

$$r_{T0} = v_I(t)\cos(w_D t) + v_Q(t)\sin(w_D t)$$

Similar to the I/Q mixer stage 520, the I/Q mixer stage 518 may, for example, use the local oscillator signals provided by the DDFS 510 for the up-conversion of the baseband transmit signals to intermediate frequency.

The output of the adder 532 may be communicatively coupled to the input of the distributed mixer 504a via the amplifier 512a. The distributed mixer 504a may be substantially similar to the modulator 330 illustrated in FIG. 3. The distributed mixer 504a may comprise suitable logic, circuitry and/or code that may be enabled to up-convert an input signal in frequency. The distributed mixer 504a may up-convert the intermediate frequency signal $r_{T0}$ to generate a radio frequency transmit signal $r_{TK}$, as described for FIG. 3. The distributed mixer 504a may use local oscillator and fractional local oscillator signals generated in the fractional LO cascade 508. The fractional LO cascade 508 may be substantially similar to the fractional LO cascade 506. The output of the distributed mixer 504a, the radio frequency signal $r_{TK}$ may be communicatively coupled to the antenna 536 via the amplifier 502a and the balun 522.

In accordance with various embodiments of the invention, the transceiver system 500 may operate in time-division duplex mode (TDD), frequency-division duplex mode (FDD) or a combined TDD/FDD mode. In cases where the transceiver system 500 may be operating in TDD mode, the transceiver may be configured to either receive or transmit at any given instance in time. In these instances, the receive and transmit carrier frequencies may be the same. In cases where the transceiver system 500 may be operating in FDD mode, the transmitter and the receiver may receive and transmit simultaneously at any instance in time. In these instances, the receive and transmit carrier frequency may be different. In cases where the transceiver system 500 may operate in combined TDD/FDD mode, the transceiver may be configured to either receive or transmit at any given instance in time, and the transmit and receive frequencies may be different in these instances.

In accordance with an embodiment of the invention, a method and system for a distributed transceiver with DDFS channel selection may comprise frequency-translating a first signal, for example $r_0(t)$, to generate one or more second signals, for example $u_I(t)$ and $u_Q(t)$, utilizing a distributed mixer, for example distributed mixer 504, and an in-phase and quadrature mixing stage, for example 520, as illustrated in FIG. 5. The first signal may be an input signal to the distributed mixer, which may comprise a plurality of frequency conversion stages, as illustrated in FIG. 2 and FIG. 3. The input signal to the distributed mixer may be an input signal to at least one of the plurality of frequency conversion stages and an output signal of the distributed mixer may be generated from one or more output signals or the plurality of conversion stages, as described for FIG. 3 and FIG. 5. The output signal from the distributed mixer may be an input signal to the in-phase and quadrature mixing stage, as illustrated in FIG. 5, and the one or more second signals may be generated from one or more output signals of the in-phase and quadrature mixing stage, for example $u_I(t)$ and $u_Q(t)$.

The plurality of frequency conversion stages may be communicatively coupled in a cascade configuration, for example like conversion stages 304, 306 and 308, illustrated in FIG. 3. The first signal may be a radio frequency signal or an intermediate frequency signal, for example $r_0(t)$ and the one or more second signals may be baseband signals, for example $u_I(t)$ and $u_Q(t)$. The first signal may be a radio frequency signal or a baseband signal and the one or more second signals may be intermediate frequency signal, for example $r_{TK}(t)$. The first signal may be a baseband signal, for example $v_I(t)$ and/or $v_Q(t)$, or an intermediate frequency signal and the one or more second signals may be radio frequency signals, for example $r_{TK}(t)$. In at least one of the plurality of frequency conversion stages, a first frequency scaled signal and a phase-shifted version of a second frequency scaled signal may be summed, where the first frequency scaled signal may be generated by multiplying a corresponding input signal with a local oscillator signal or a fractional local oscillator signal, and the second frequency scaled signal may be generated by multiplying the corresponding input signal with a phase-shifted version of the local oscillator signal or a phase-shifted version of the fractional local oscillator signal, as explained for FIG. 2. One or more oscillator signals for the in-phase and quadrature mixing stage may be generated using a Direct Digital Frequency Synthesizer (DDFS), for example DDFS 510, and a particular frequency bandwidth may be selected for reception and/or transmission on a desired channel by adjusting one or more output frequencies of the one or more generated oscillator signals, as described for FIG. 5. The fractional local oscillator cascade, for example fractional LO cascade 506, may be used to generate one or more local oscillator signals and fractional local oscillator signal that may be used for the frequency-translating in the plurality of frequency conversion stages, as described for FIG. 2, FIG. 3 and FIG. 5. The fractional oscillator cascade may comprise one or more frequency dividers, as illustrated in FIG. 3, for example.

Another embodiment of the invention may provide a machine-readable storage, having stored thereon, a computer program having at least one code section executable by a machine, thereby causing the machine to perform the steps as described above for a method and system for a distributed transceiver with DDFS channel selection.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:

frequency-translating a first signal to generate one or more second signals utilizing a distributed mixer and an in-phase and quadrature mixing stage, said distributed mixer comprising a plurality of frequency conversion stages;

summing in at least one of said plurality of frequency conversion stages, a first frequency scaled signal and a phase-shifted version of a second frequency scaled signal, where said first frequency scaled signal is generated by multiplying a corresponding input signal with a local oscillator signal or a fractional local oscillator signal, and said second frequency scaled signal is generated by multiplying said corresponding input signal with a phase-shifted version of said local oscillator signal or a phase-shifted version of said fractional local oscillator signal, wherein:

said first signal is an input signal to said distributed mixer;

said input signal to said distributed mixer is an input signal to at least one of said plurality of frequency conversion stages and an output signal of said distributed mixer is generated from one or more output signals of said plurality of conversion stages; and said output signal from said distributed mixer is an input signal to said in-phase and quadrature mixing stage and said one or more second signals are generated from one or more output signals of said in-phase and quadrature mixing stage.

2. The method according to claim 1, wherein said plurality of frequency conversion stages are communicatively coupled in a cascade configuration.

3. The method according to claim 1, wherein said first signal is a radio frequency signal or an intermediate frequency signal and said one or more second signals are baseband signals.

4. The method according to claim 1, wherein said first signal is a radio frequency signal or a baseband signal and said one or more second signals are intermediate frequency signal.

5. The method according to claim 1, wherein said first signal is a baseband signal or an intermediate frequency signal and said one or more second signals are radio frequency signals.

6. The method according to claim 1, comprising generating one or more oscillator signals for said in-phase and quadrature mixing stage using a Direct Digital Frequency Synthesizer (DDFS).

7. The method according to claim 6, comprising selecting a particular frequency bandwidth for reception and/or transmission on a desired channel by adjusting one or more output frequencies of said one or more generated oscillator signals.

8. The method according to claim 1, wherein a fractional local oscillator cascade is used to generate one or more local oscillator signals and fractional local oscillator signal that are used for said frequency-translating in said plurality of frequency conversion stages.

9. The method according to claim 8, wherein said fractional oscillator cascade comprises one or more frequency dividers.

10. A system for processing communication signals, the system comprising:

one or more circuits comprising a distributed mixer and an in-phase and quadrature mixing stage, said distributed mixer comprising a plurality of frequency conversion stages, said one or more circuits being enabled to frequency-translate a first signal to generate one or more second signals utilizing said distributed mixer and an in-phase and quadrature mixing stage;

said one or more circuits sum a first frequency scaled signal and a phase-shifted version of a second frequency scaled signal, where said first frequency scaled signal is generated by multiplying a corresponding input signal with a local oscillator signal or a fractional local oscillator signal, and said second frequency scaled signal is generated by multiplying said corresponding input signal with a phase-shifted version of said local oscillator signal or a phase-shifted version of said fractional local oscillator signal, wherein:

said first signal is an input signal to said distributed mixer;

said input signal to said distributed mixer is an input signal to at least one of said plurality of frequency conversion stages and an output signal of said distributed mixer is generated from one or more output signals of said plurality of conversion stages; and said output signal from said distributed mixer is an input signal to said in-phase and quadrature mixing stage and said one or more second signals are generated from one or more output signals of said in-phase and quadrature mixing stage.

11. The system according to claim 10, wherein said plurality of frequency conversion stages are communicatively coupled in a cascade configuration.

12. The system according to claim 10, wherein said first signal is a radio frequency signal or an intermediate frequency signal and said one or more second signals are baseband signals.

13. The system according to claim 10, wherein said first signal is a radio frequency signal or a baseband signal and said one or more second signals are intermediate frequency signal.

14. The system according to claim 10, wherein said first signal is a baseband signal or an intermediate frequency signal and said one or more second signals are radio frequency signals.

15. The system according to claim 10, wherein said one or more circuits comprise a Direct Digital Frequency Synthesizer (DDFS), and said one or more circuits generate one or more oscillator signals for said in-phase and quadrature mixing stage using said Direct Digital Frequency Synthesizer (DDFS).

16. The system according to claim 15, wherein said one or more circuits select a particular frequency bandwidth for reception and/or transmission on a desired channel by adjusting one or more output frequencies of said one or more generated oscillator signals.

17. The system according to claim 10, wherein said one or more circuits comprise a fractional local oscillator cascade and said fractional local oscillator cascade is used to generate one or more local oscillator signals and fractional local oscillator signal that are used for said frequency-translating in said plurality of frequency conversion stages.

18. The system according to claim 17, wherein:

said one or more circuits comprises one or more frequency dividers; and said fractional oscillator cascade comprises said one or more frequency dividers.

* * * * *